United States Patent

Takeshima et al.

[11] Patent Number: 5,936,498
[45] Date of Patent: Aug. 10, 1999

[54] SUPERCONDUCTING MAGNET APPARATUS AND MAGNETIC RESONANCE IMAGING SYSTEM USING THE SAME

[75] Inventors: Hirotaka Takeshima; Hajime Kawano, both of Tokyo; Shigeru Kakugawa, Hitachi, all of Japan

[73] Assignee: Hitachi Medical Corporation, Tokyo, Japan

[21] Appl. No.: 08/913,062
[22] PCT Filed: Jan. 10, 1997
[86] PCT No.: PCT/JP97/00039
   § 371 Date: Sep. 5, 1997
   § 102(e) Date: Sep. 5, 1997
[87] PCT Pub. No.: WO97/25726
   PCT Pub. Date: Jul. 17, 1997

[30] Foreign Application Priority Data

Jan. 10, 1996 [JP] Japan .................................. 8-019503

[51] Int. Cl.⁶ .......................................................... H01F 1/00
[52] U.S. Cl. ............................ 335/216; 335/299; 324/318
[58] Field of Search .................................. 335/216, 296, 335/297, 298, 299, 300, 301; 324/318, 319, 320, 321; 505/892, 893

[56] References Cited

U.S. PATENT DOCUMENTS 5,402,094  3/1995  Enge ........................................ 335/296
5,410,287  4/1995  Laskaris .
5,545,997  8/1996  Westphal et al. ....................... 324/320

FOREIGN PATENT DOCUMENTS 2-27704  1/1997  Japan .
9-153408  6/1997  Japan .

Primary Examiner—Lincoln Donovan
Attorney, Agent, or Firm—Antonelli, Terry, Stout & Kraus, LLP

[57] ABSTRACT

In a superconducting magnet apparatus for use in a magnetic resonance imaging system, an opening for accommodating a subject is enlarged, so that the subject is prevented from feeling claustrophobic, that an operator easily gets access to the subject, that low magnetic field leakage therefrom is realized, and that the manufacturing cost thereof can be reduced. In the superconducting magnet apparatus provided with two sets of superconducting coils placed across a uniform magnetic field region at an equal distance therefrom in such a manner as to face each other, disk-like ferromagnetic substances and cylindrical ferromagnetic substances are disposed around the superconducting coils. Further, a plurality of column-like ferromagnetic substances are interposed between the cylindrical ferromagnetic substances facing each other. Thus, a return path for external magnetic flux generated by the superconducting magnet coils is constituted. Consequently, the opening for accommodating a subject is enlarged, so that subjects can be prevented from feeling claustrophobic, that an operator can easily gets access to the subject, that low magnetic field leakage therefrom can be realized, and that the manufacturing cost thereof can be reduced.

14 Claims, 10 Drawing Sheets 5,936,498

SUPERCONDUCTING MAGNET APPARATUS AND MAGNETIC RESONANCE IMAGING SYSTEM USING THE SAME

TECHNICAL FIELD

The present invention relates to a superconducting magnet apparatus that is suitable for use in a magnetic resonance imaging system (hereunder referred to as "MRI system"). More particularly, the present invention relates to a superconducting magnet apparatus having a large opening to thereby prevent a subject from feeling claustrophobic, to thereby allow an operator to have easy access to a subject, to thereby reduce magnetic field leakage and to thereby cut down the manufacturing cost, and also relates to an MRI system using such a superconducting magnet apparatus.

BACKGROUND ART

FIG. 11 illustrates an example of a conventional superconducting magnet apparatus for use in MRI system. This example is a superconducting magnet apparatus of the horizontal magnetic field type. This superconducting magnet apparatus is composed of small-diameter main coils 13, 14, 15, 16, 17 and 18 and large-diameter shield coils 19 and 20 and is adapted to produce a horizontal (namely, Z-axis direction) magnetic field. In this example, the main coils 13 to 18 are placed to produce a magnetic field along the center axis 22 of a magnet, while the shield coils 19 and 20 are placed to shield magnetic field leakage to the surroundings thereof. With such a configuration of the magnet, a uniform magnetic field region 21 of magnetic homogeneity of about 10 ppm or less is formed in a magnetic field space. Magnetic resonance imaging is performed in this uniform magnetic field 21.

These coils are made by using superconducting wires, and thus are required to be cooled to a predetermined temperature (for example, liquid-helium temperature (namely, 4.2 K) in the case of alloy superconductors; and liquid-nitrogen temperature (namely, 77 K) in the case of oxide superconductors). The coils are, therefore, held in a cooling vessel consisting of a vacuum enclosure, a thermal shield and a coolant container (which contains liquid helium or the like). In the case of the example of FIG. 11, the main coils 13 to 18 and the shield coils 19 and 20 are placed in the coolant container 11 containing coolant 12, such as liquid helium, for superconductivity, and are supported by means of supporting elements (not shown). Further, the coolant container 11 is held in the vacuum enclosure 10.

Moreover, to keep each of the coils at a low temperature, the thermal shield is maintained at a constant temperature by using a refrigerator (not shown), or the evaporation of coolant 12 for superconductivity is reduced. Recently, the performance of refrigerators has been increased, so that the superconductor coils are sometimes, cooled directly by the refrigerator without using the coolant 12 for superconductivity.

However, in the case of the superconducting magnet apparatus illustrated in FIG. 11, an opening, in which a subject is accommodated and images of the subject are taken, is narrow and moreover, a measuring space is surrounded, so that subjects sometimes feel claustrophobic. Thus, occasionally, subjects refuse to enter the opening of the apparatus for examination. Furthermore, it is difficult for an operator to get access to a subject from the outside of the superconducting magnet apparatus.

FIG. 12 illustrates a second example of a conventional superconducting magnet apparatus for use in MRI system. This example is a superconducting magnet apparatus of the vertical magnetic field type. FIG. 12(a) is a schematic external view of this apparatus. FIG. 12(b) is a sectional view taken in the direction of an arrow A of FIG. 12(a). This example of the conventional superconducting magnet apparatus is disclosed in the U.S. Pat. No. 5,194,810. In this magnet, a magnetic field is produced by two sets of superconducting coils 23 and 23, which are placed vertically in a line in such a manner as to face each other. Further, iron shimming means 24 are provided inside each of the aforesaid superconducting coils 23 and 23 so as to obtain favorable magnetic homogeneity. Thereby, this magnet enhances the magnetic homogeneity of the uniform magnetic field region 21. Moreover, this magnet has a structure in which iron plates 25, 25 and iron yokes 26, 26, . . . also serving as return paths for magnetic fields generated by the upper and lower superconducting coils 23 and 23, are placed, each of the aforementioned iron plates 25 supporting the corresponding superconducting coil 23 and the corresponding shimming means 24 and the iron yokes 26 intervening between the iron plates 25, 25 to mechanically support the iron plates 25, 25.

In the case of this example of the conventional superconducting magnet apparatus, the uniform magnetic-field region 21 is opened in all directions, a subject can avoid feeling claustrophobic. Moreover, an operator can easily get access to the subject. Further, magnetic field leakage can be reduced because of the fact that the return path of a magnetic flux is composed of the aforementioned iron plates 25, 25 and the aforementioned iron yokes 26, 26, . . .

However, in the case of the superconducting magnet apparatus illustrated in FIG. 12, there are caused the problems that the iron plates 25 and the iron yokes 26 are used as above described, so that the entire magnet becomes heavy and that thus, when installing the superconducting magnet apparatus, an installation floor needs to be reinforced. Further, because the saturation magnetic flux density of iron is approximately 2 Tesla or so, there is a restraint on the magnet in that the magnetic field strength cannot be increased to a high value. Furthermore, there are possibilities that a magnetic field generated by a gradient magnetic field coil affects the magnetic field distribution due to the hysteresis characteristics of iron with respect to the magnetic field. This may hinder high-precision signal measurement Inventors of the present invention filed another Japanese patent application (title of the invention: a superconducting magnet apparatus, applicant: Hitachi Medical Corporation, and application No.: 336023/1995), in which an invention (hereunder referred to as a "third example of the conventional superconducting magnet apparatus") is presented as having solved the problems of the aforementioned two examples of the conventional apparatus) on Nov. 30, 1995. Apparatus according to this invention is of the open vertical-magnetic-field type. The configuration of this apparatus is schematically illustrated in FIG. 13. FIG. 13(a) is a sectional view of this apparatus. FIG. 13(b) is an external view thereof. As shown in FIG. 13(a), two sets of superconducting coils, which are accommodated in vacuum enclosures 10A and 10B and coolant containers 11A and 11B, are spaced apart from each other by a predetermined distance in such a manner as to be coaxial with the center axis 22 of the magnet. Further, a uniform magnetic field region 21 is generated at the halfway position between the sets of the coils. The aforementioned superconducting coils are composed of: coils 31A and 31B (hereunder referred to as "main coils") for generating a primary magnetic field in a uniform magnetic region 21; coils 32A and 32B (hereunder referred to as "bucking coils") for canceling out an external magnetic field by generating a magnetic field, which is in opposite direction to the magnetic field produced by the main coils; and coils 33A, 34A, 35A, 33B, 34B and 35B (hereunder referred to as "regulating coils") for correcting the magnetic homogeneity of the uniform magnetic field region 21. The vacuum enclosures 10A and 10B are intervened and supported by supporting posts 36, 36. Characteristic aspect of this invention resides in that the magnetic leakage is reduced by canceling out the external magnetic field, which is produced by the main coils 31A and 31B, by the bucking coils 32A and 32B. In this case, iron is not used for reducing the leakage magnetic field. Consequently, there is not caused such a problem as in the second example of the conventional magnetic superconducting magnet apparatus.

However, in the case of this third example of the conventional superconducting magnet apparatus, the magnetic strength of the uniform magnetic field region 21 is also reduced because of the use of the bucking coils 32A and 32B. As a result, when increasing the magnetic strength of the uniform magnetic field region 21, magnetomotive forces required to the main coils 31A and 31B and the bucking coils 32A and 32B become huge. This results in rise of the manufacturing cost of the magnet apparatus. Further, the electromagnetic force applied to each of the superconducting coils increases according to the magnetomotive force. Therefore, strict structural conditions are imposed. Incidentally, generally, the shorter the distance between each of the bucking coils 32A and 32B and the corresponding one of the main coils 31A and 31B becomes, the more the magnetic fields generated by both of the bucking coil and the corresponding one of the main coils is canceled out. Consequently, the aforementioned problem becomes more serious.

In contrast, when increasing the distance between both of the bucking coil and the corresponding main coil, the size of each of the coolant containers 11A and 11B for containing these coils becomes large. This also causes a rise in the manufacturing cost of the apparatus. Further, the position of the uniform magnetic field region 21, into which a subject is inserted, from the floor face becomes high. This presents a problem in the safety of a subject.

As above described, in the case of conventional superconducting magnet apparatuses, it is difficult to enlarge openings, into each of which a subject is inserted, so as to prevent the subject from feeling claustrophobic, and to reduce magnetic field leakage, and to obtain a large high-magnetic-strength uniform magnetic field region. Moreover, it is also difficult to reduce the manufacturing costs to low values.

It is, accordingly, an object of the present invention to provide a superconducting magnet apparatus which deals with such problems of the conventional superconducting magnet apparatuses, and which enlarges openings for accommodating a subject to the extent that the subject does not feel claustrophobic and which has low magnetic field leakage, and which can realize a large high-magnetic-field-strength uniform magnetic field region and which reduces the manufacturing cost thereof to a low value, and to provide a magnetic resonance imaging system using this semiconducting magnet apparatus.

DISCLOSURE OF INVENTION

To achieve the foregoing object, in accordance with the present invention, there is provided a superconducting magnet apparatus that comprises: a magnetic field generating sources, each of which is made of substances having superconducting properties and is operative to feed electric current for generating a uniform magnetic field in a first direction, in a finite region; cooling means for cooling the aforesaid magnetic field generating sources to a temperature, at which the substances exhibit the superconducting properties, and for maintaining the aforesaid magnetic field generating source at the temperature; and supporting means for supporting the aforesaid magnetic field generating sources. Further, each of the aforementioned magnetic field generating sources consisting of two sets of magnetic field generating devices that are placed equidistantly in such a way as to face each other across the aforementioned uniform magnetic field region along the first direction and are adapted to feed electric current in a second direction which is along the circumference of a circle whose center axis extends in the aforesaid first direction. Moreover, each of the sets of magnetic field generating devices is composed of: one or more first magnetic field generating devices for feeding electric current which flows in the second direction so as to generate a main component of the aforesaid uniform magnetic field; and one or more second magnetic field generating devices for feeding electric current in a direction which is the same as or is opposite to the aforesaid second direction, so as to improve magnetic homogeneity of the aforesaid uniform magnetic field. Furthermore, the diameter of each of the aforesaid second magnetic field generating devices is smaller than the outside diameter of each of the first magnetic field generating devices. An amount of electric current flowing in the aforesaid second magnetic field generating devices is less than an amount of electric current flowing in the aforesaid first magnetic field generating devices. The aforesaid cooling means is composed of: two sets of nearly cylindrical cooling vessels for accommodating the aforementioned sets of magnetic field generating devices; and a supporting structure interposed between the aforesaid cooling vessels. Further, first ferromagnetic substances are placed in such a manner as to surround each of the aforesaid sets of magnetic field generating devices. Moreover, one or more second ferromagnetic substances are placed in a space across which the aforesaid first ferromagnetic substances face each other.

Thus, there can be realized an apparatus which has a large opening, so that a subject is prevented from feeling claustrophobic, and that an operator easily gets access to the subject. Moreover, magnetic field leakage therefrom to the outside of the apparatus can be reduced by surrounding each of the aforementioned magnetic field generating devices with the ferromagnetic substances. Furthermore, no bucking coils are used differently from the conventional apparatus. Consequently, the manufacturing cost thereof can be cut down.

Further, in the superconducting magnet apparatus of the present invention, the aforementioned first ferromagnetic substances may consist of: disk-like ferromagnetic elements placed at positions apart from the aforementioned magnetic field generating sources when setting the aforementioned uniform magnetic field region as a reference place; and cylindrical ferromagnetic elements placed on the outer peripheries of the aforesaid magnetic field generating sources. The aforesaid second ferromagnetic substances may be constituted by one or more column-like ferromagnetic elements. Further, both end portions of each of the aforesaid column-like ferromagnetic elements may be placed in such a way as to be close to one end of each of the aforesaid cylindrical ferromagnetic elements.

Further, in the superconducting magnet apparatus of the present invention, the aforesaid cooling means may include a cooling vessel which contains the aforesaid magnetic field generating sources therein. Further, at least a part of the aforesaid first ferromagnetic substances may be placed in the aforesaid cooling vessel.

Moreover, in the superconducting magnet apparatus of the present invention, a part of said first ferromagnetic substances may be placed on the exterior of said cooling vessel.

Furthermore, in the superconducting magnet apparatus of the present invention, a part of the aforesaid first ferromagnetic substances, which is placed on the exterior of said cooling vessel, may be the aforesaid cylindrical ferromagnetic elements.

Additionally, in the superconducting magnet apparatus of the present invention, the aforesaid first ferromagnetic substances also may serve as at least a part of composing elements of the aforesaid cooling vessel.

Further, in the superconducting magnet apparatus of the present invention, the aforesaid second ferromagnetic substances also may serve as at least a part of composing elements of the aforementioned supporting structure.

Moreover, in the superconducting magnet apparatus of the present invention, a plurality of the aforesaid second ferromagnetic substances may be placed. Furthermore, a length of a cylindrical portion of each of said cylinder ferromagnetic elements of said first ferromagnetic substances may not be uniform, therefore, the length of the cylindrical portion of each of the aforesaid cylindrical ferromagnetic elements of the aforesaid first ferromagnetic substances within a part, in which the aforesaid second ferromagnetic substances are present, may be longer than the length of the cylindrical portion of each of the aforesaid cylindrical ferromagnetic elements of the aforementioned first ferromagnetic substances within a part, in which the aforementioned second ferromagnetic substances are not present.

Furthermore, in the superconducting magnet apparatus of the present invention, two sets of the aforesaid second ferromagnetic substances may be placed at positions that are nearly equidistantly away from the aforesaid uniform magnetic field region in a third direction which is orthogonal to the aforesaid first direction. Further, the length in the third direction of each of the aforesaid first ferromagnetic substances may be longer than the length thereof in a direction orthogonal to both of the aforesaid first and third directions.

Further, in the superconducting magnet apparatus according of the present invention, the aforesaid magnetic field generating sources may be placed so as to correct a magnetic field generated in said uniform magnetic field region by combining the aforesaid first ferromagnetic substances with the aforementioned second ferromagnetic substances, so that desired magnetic field strength and homogeneity are obtained in said uniform magnetic field region.

Furthermore, in the superconducting magnet apparatus of the present invention, the aforesaid magnetic field generating devices may include third magnetic field generating devices for feeding electric current in a direction in which a magnetic flux density within the aforesaid first ferromagnetic substance is reduced.

Additionally, in the superconducting magnet apparatus of the present invention, the magnetomotive force of each of the aforesaid third magnetic field generating devices may be selected so that the weight of the aforementioned first ferromagnetic substances becomes almost minimum.

Further, a magnetic resonance imaging system of the present invention comprises: a magnetostatic field generating means for giving a magnetostatic field to a subject; a gradient magnetic field generating means for giving a gradient magnetic field to the subject; a transmitting system for irradiating the subject with high-frequency signals so as to cause nuclear magnetic resonance in atomic nuclei of atoms composing tissues of the subject; a receiving system for detecting high-frequency signals issued due to the nuclear magnetic resonance; and a signal processing system for performing an image reconstruction operation by using the high-frequency signals detected by the aforesaid receiving system and for displaying an image. Furthermore, the aforementioned superconducting magnet apparatus recited in one of the foregoing items is used as the aforesaid magnetostatic field generating means.

Thereby, a magnetic resonance imaging system having a magnetic field generating means, in which a large opening is provided so that a subject does not feel claustrophobic and that an operator can easily get access to the subject, and in which each of the sets of the magnetic field generating devices is surrounded by the ferromagnetic substances so that magnetic field leakage to the outside of the apparatus is reduced and that the manufacturing cost is able to be cut down, can be realized.

BEST MODE FOR CARRYING OUT THE INVENTION

Hereinafter, embodiments of the present invention will be described in detail with reference to the accompanying drawings.

Figure 1A:
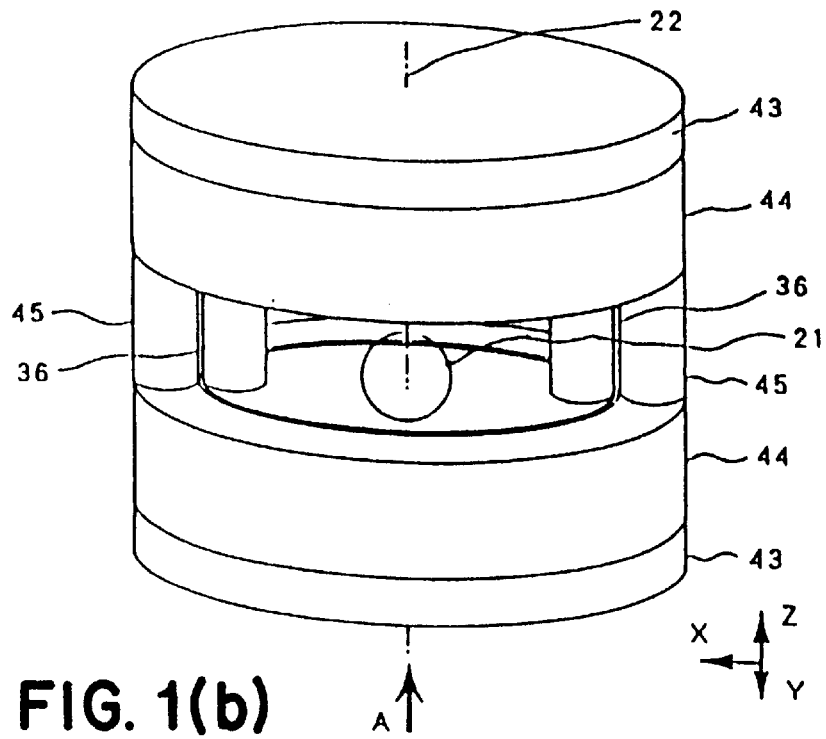
FIGS. 1(a)–(c) are diagrams illustrating a first embodiment of a superconducting magnet apparatus according to the present invention.
Figure 1B:
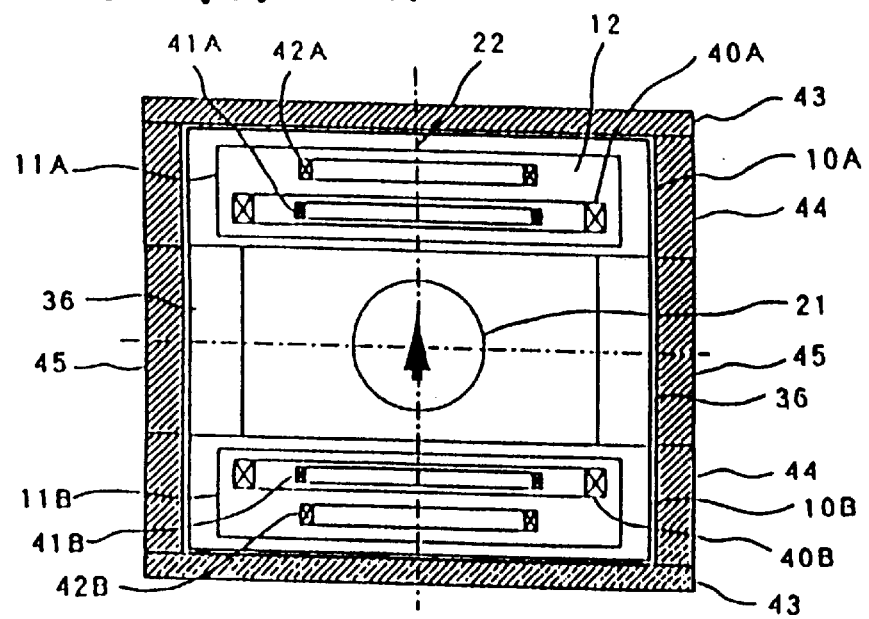
Figure 1C:
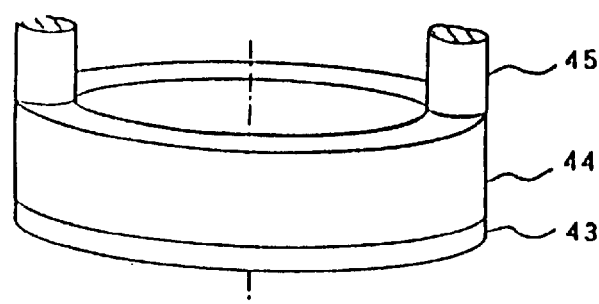

FIG. 1 illustrates a first embodiment of a superconducting magnet apparatus according to the present invention. FIG. 1(a) is an external view of the configuration of the entire apparatus. FIG. 1(b) is a longitudinal sectional view taken on a center line of the apparatus. FIG. 1(c) is a partial external view of the apparatus. First basic composing elements of the superconducting magnet apparatus are superconducting coils 40A, 41A, 42A; 40B, 41B, 42B. Further, other basic composing elements are coolant containers 11A and 11B for cooling these superconducting coils 40A to 42B to a temperature, at which predetermined superconducting properties are obtained, and for keeping these superconducting coils at this temperature. Moreover, other basic composing elements are ferromagnetic substances 43, 44 and 45 according to the present invention to be placed around the aforementioned superconducting coils 40A to 42B. Incidentally, although omitted in FIG. 1 for simplicity of drawing, structural elements for supporting the aforementioned superconducting coils 40A to 42B are provided in the apparatus.

As the materials of the aforementioned superconducting coils 40A to 42B, alloy superconductor wires, such as Nb—Ti wires, and oxide superconductor wires are used. Hereunder, there will be described the case where Nb—Ti wires, which are usually frequently used as the material of superconducting coils, are employed. Further, liquid helium is employed as the coolant 12 for superconductivity, which is used for cooling the superconducting coils 40A to 42B made out of Nb—Ti wires. Moreover, the coolant containers 11A and 11B for accommodating the liquid helium are held within the vacuum enclosures 10A and 10B. In addition to these, thermal shields (not shown) for preventing an occurrence of thermal radiation are placed in these vacuum enclosures 10A and 10B. The aforementioned superconducting coils 40A to 42B are used under conditions of being enclosed in these vacuum enclosures 10A and 10B, respectively. Incidentally, when using superconductors ($Nb_3Sn$ and oxide superconductors), which can be used at high temperatures, are adopted as the materials of the superconducting coil wires, the direct cooling by means of a refrigerator or the cooling by the use of liquid nitrogen can be achieved as stated in the description of the first example of the conventional apparatus.

The aforementioned superconducting coils 40A to 42A and 40B to 42B are placed across a uniform magnetic region 21, which is formed nearly in the central portion of the apparatus, vertically in such a way as to be coaxial and symmetrical with the center axis 22. In accordance with this, the cylindrical vacuum enclosures 10A and 10B, which respectively contain a set of the superconducting coils 40A to 42A and another set of the superconducting coils 40B to 42B, are placed across the aforementioned uniform magnetic field region 21 in such a manner as to be coaxial with the center axis 22 of the magnet and as to face each other vertically and as to be symmetrical with the center of the apparatus. Both of the vacuum enclosures 10A and 10B are supported by supporting posts 36, which are interposed therebetween, in such a manner as to be a predetermined distance apart from each other. These supporting posts 36 may have the function of thermally connecting upper and lower coolant containers 11A and 11B with each other according to circumstances, in addition to the function of mechanically supporting the upper and lower coolant containers 11A and 11B. With such a configuration, the necessity of providing a refrigerator or the like at each of the upper and lower coolant containers is eliminated. Consequently, a single refrigerator suffices for the entire apparatus. Moreover, the number of the supporting posts 26 is not always limited to two as illustrated in the figure but may be three or four. Alternatively, a single supporting post of the cantilever type may be employed so that a subject feels free and relaxed.

In FIG. 1(b), the superconducting coils are illustrated as an upper set of three superconducting coils 40A, 41A and 42A and a lower set of three superconducting coils 40B, 41B and 42B. The function of these superconducting coils is to generate a strong magnetostatic field, which has good magnetic homogeneity, in the uniform magnetic field region 21. The superconducting coils 40A and 40B (hereunder referred to as "main coils"), which have the largest diameter, are used for generating a magnetic field, whose magnetic field strength is high and is equal to or greater than a predetermined level, in the uniform magnetic field region 21. In contrast, the superconducting coils 41A, 41B; 42A, 42B (hereunder referred to as "regulating coils"), which have the small diameter, are used for regulating the magnetic homogeneity of the magnetostatic field generated in the uniform magnetic field region 21 by the aforementioned main coils 40A and 40B. Thus, the magnetic homogeneity is improved by regulating the placement and the magnetomotive force of each of the coils 41A, 41B; 42A, 42B. Further, the direction of electric current flowing through the aforementioned regulating coil has only to be determined corresponding to each of the coils 41A, 41B; 42A 42B according to an inhomogeneous component of the magnetic field generated by the main coils 40A and 40B. There is no need for limiting the direction of such electric current only to a specific fixed direction. The direction of such electric current may be selected suitably as the same or opposite direction as of electric current passing through the main coil. Moreover, the number of the aforementioned superconducting coils of each of the upper and lower sets is not limited to three but may be two or less, alternatively, may be four. Namely, the most appropriate number of the aforementioned superconducting coils of each of the upper and lower sets has only to be determined according to a balance between the inhomogeneous component of the magnetic field and the manufacturing cost of the apparatus. Generally, as the diameter of the main coil is increased, the inhomogeneous component of the magnetic field is decreased. Thus, the number of and the magnetomotive force of the regulating coils 41A, 41B; 42A, 42B can be decreased.

This embodiment has a structure, in which magnetic field leakage generated by the aforementioned superconducting coils outside the apparatus is effectively reduced by ferromagnetic substances 43, 44 and 45. As illustrated in FIG. 1(b), the upper and lower vacuum enclosures 10A and 10B are surrounded by the ferromagnetic substances 43 and 44, respectively, and in which the upper and lower ferromagnetic substances 44, 44 are magnetically connected with each other by column-like ferromagnetic substances 45. The aforementioned ferromagnetic substance 43, 43 are shaped like a disk and are placed above the vacuum enclosure 10A and under the other vacuum enclosure 10B, respectively. Further, the ferromagnetic substances 44 are cylindrical and are placed in such a manner as to surround the aforementioned vacuum enclosures 10A and 10B, respectively. Each of the ferromagnetic substances 43 is magnetically connected to a corresponding one of the ferromagnetic substances 44. Any material exhibiting ferromagnetism may be used as the ferromagnetic material used in this embodiment. In view of the ferromagnetic properties, the cost and the mechanical strength of materials, generally, iron is preferable. FIG. 1(c) is an external view of the ferromagnetic substances 43, 44 and 45 (only of a lower part of the apparatus) for reference purpose by extracting these ferromagnetic substances therefrom.

Figure 12A:
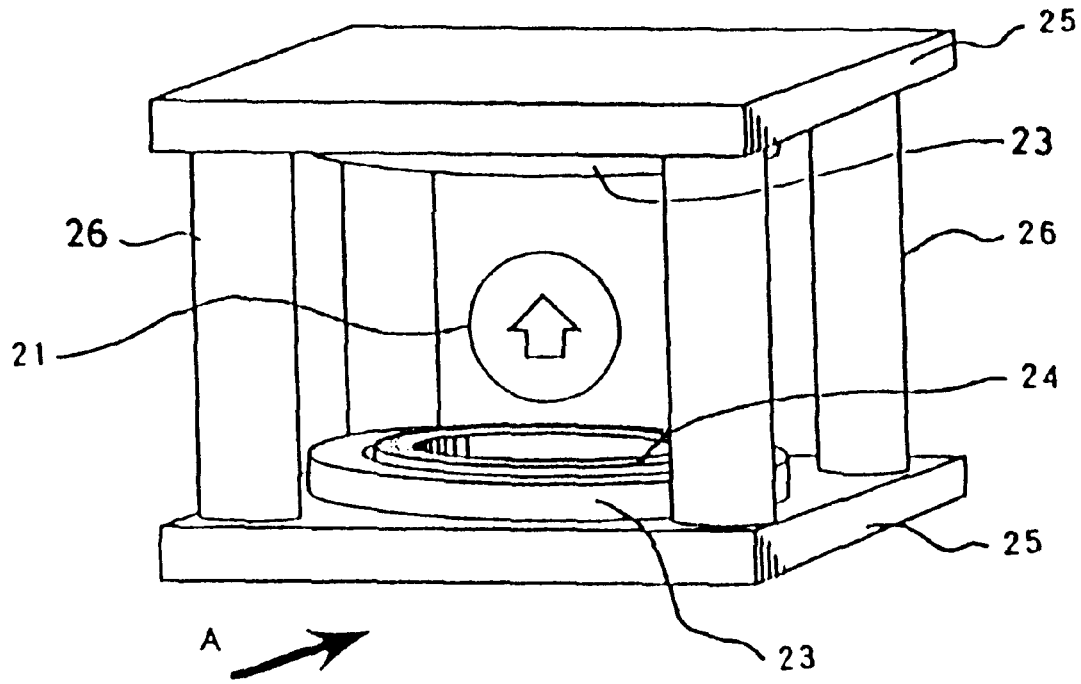
FIGS. 12(a)–(b) show respectively an external view and a sectional view thereof taken in the direction of an arrow A of the second example of a conventional superconducting magnet apparatus for use in MRI system.
Figure 12B:
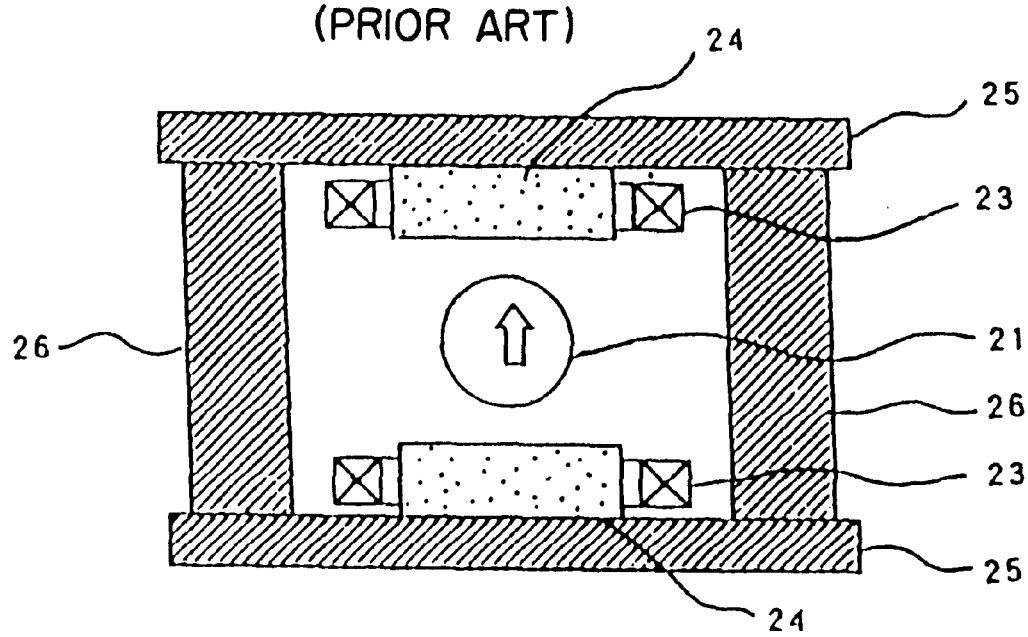
Figure 13A:
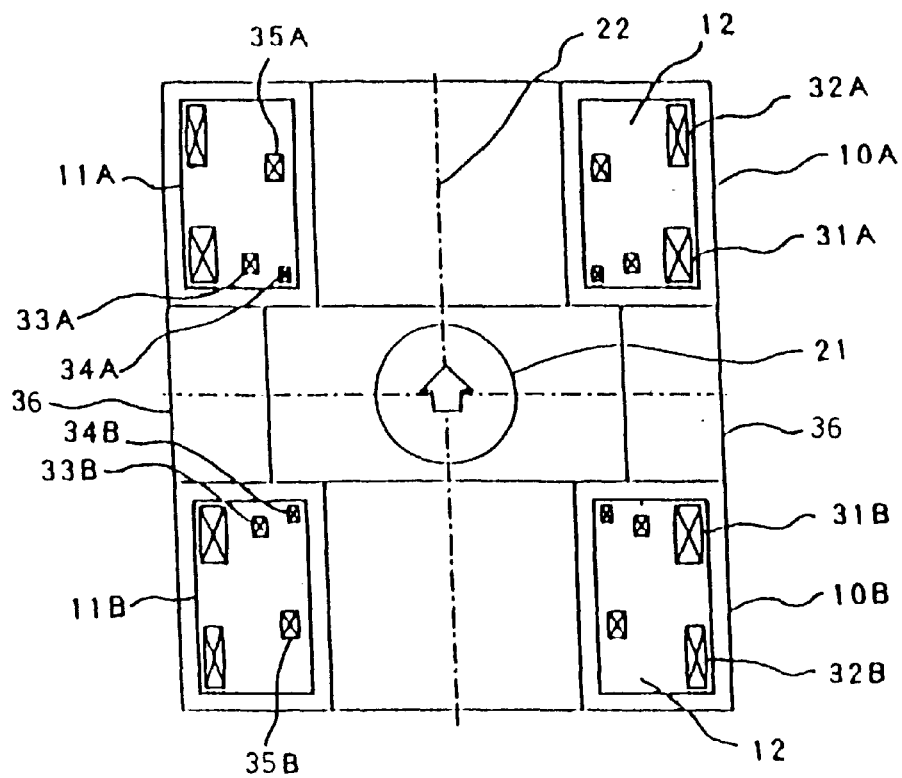
FIGS. 13(a)–(b) shows a sectional view and an external view of the third example of the conventional superconducting magnet apparatus for use in MRI system.
Figure 13B:
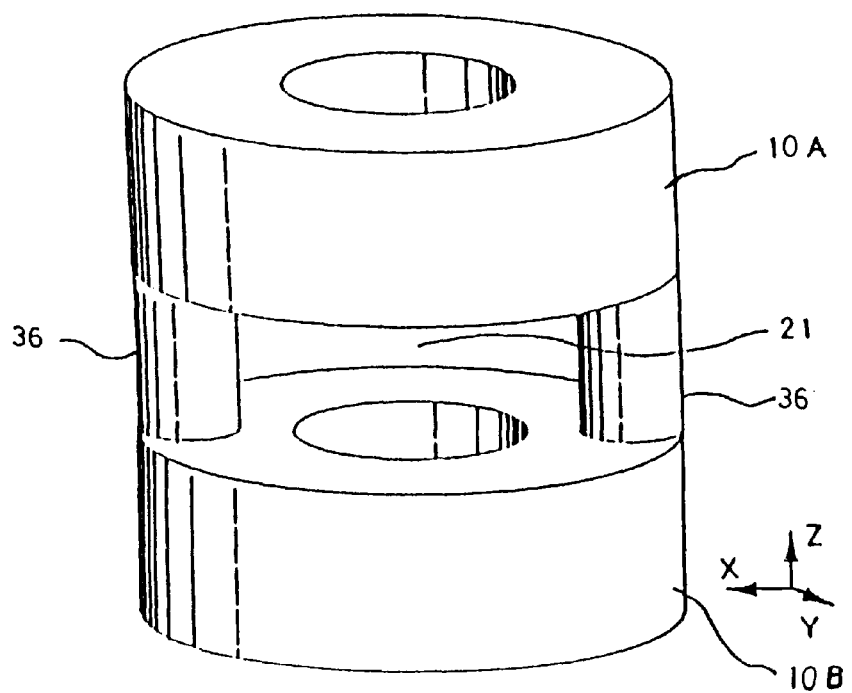

Magnetic paths are formed in the aforesaid ferromagnetic substances 43, 44 and 45 by surrounding the superconducting coils by the ferromagnetic substances as above described. Thus, the leakage magnetic field can be restrained from spreading to and reaching a distant place from the apparatus. Moreover, in the case of this structure, desired magnetic homogeneity is attained by optimizing the magnetomotive force and placement of the superconducting coils without using such a magnetic field homogenizing means as used in the second example of the conventional apparatus (see FIG. 12). As a result, this embodiment has an advantage in preventing an occurrence of a problem that a pulse magnetic field generated by the gradient magnetic field coils affects the magnetic-field distribution in the magnetic field. Therefore, a stable magnetic-field distribution can be obtained. Consequently, a high-precision signal measurement can be performed. Moreover, the ferromagnetic substances are not disposed at places close to the superconducting coils, differently from the magnetic field homogenizing means. Thus, the magnetic saturation of the ferromagnetic substances hardly occurs. Moreover, such placement of the ferromagnetic substances facilitates obtaining high magnetic field strength.

Further, this embodiment does not use bucking coils as provided in the third example of the conventional apparatus. Thus, the magnetomotive force required to obtain a desired magnetic field strength is reduced nearly to a half to one-third of that required in the third example of the conventional apparatus. Thus, the length of the superconducting wires used for the superconducting coils decreases. Consequently, this embodiment has considerable merits in reducing the cost of materials, the processing cost, the assembling cost of the apparatus.

Incidentally, the column-like ferromagnetic substances 45 of a given number may be used, if necessary. However, generally, by setting the number of the column-like ferromagnetic substances 45 as being equal to that of the supporting posts 36, this embodiment has an advantage in permitting a subject to feel that the space, in which the subject is accommodated, is large.

Furthermore, as illustrated in FIG. 1(b), the disk-like ferromagnetic substances 43 are placed in the upper and lower parts of the entire apparatus. However, the ferromagnetic substances 43 provided in the lower part of the apparatus can be omitted in the case that there is no harm in causing a leakage magnetic field in a lower portion of a room, in which the apparatus is installed. In this case, the weight of the apparatus can be decreased. Incidentally, the placement of the ferromagnetic substances of the upper and lower sets becomes asymmetrical. Thus, it is necessary to change the placement of the superconducting coils in such a manner as to correspond to the asymmetrical placement of the ferromagnetic substances.

Moreover, FIG. 1(b) shows the cylindrical ferromagnetic substances 44, whose lengths in the direction of the center axis 22 are uniform. However, the length of the ferromagnetic substance 44 is not necessarily uniform along the circumference thereof. Thus, the ferromagnetic substance 44 may be adapted so that a part thereof, in which the supporting posts 36 and the column-like ferromagnetic substances 45 are present, are long, while the remaining part thereof are short. As a result, the part, in which neither the supporting posts 36 nor the column-like ferromagnetic substances 45 are present, is long, namely, the distance between the upper and lower cylindrical ferromagnetic substances 44 and 44 in the direction, in which a subject is inserted, becomes large, so that the feeling of freedom of the subject is enhanced.

Figure 2A:
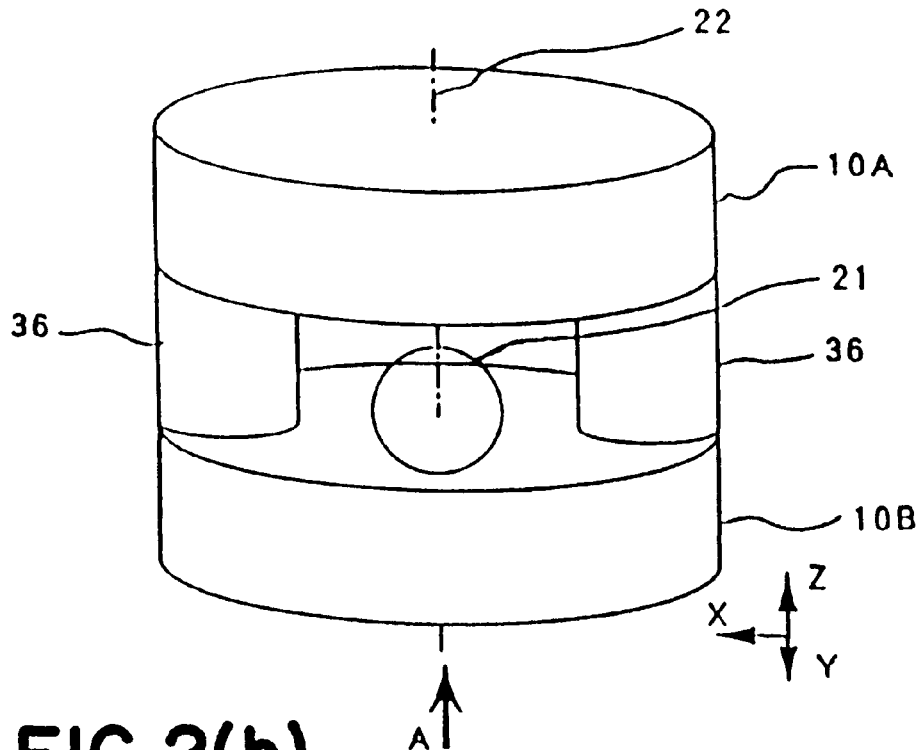
FIGS. 2(a)–(b) show respectively an external view and a longitudinal sectional view taken on a center line of a second embodiment of the superconducting magnet apparatus according to the present invention.
Figure 2B:
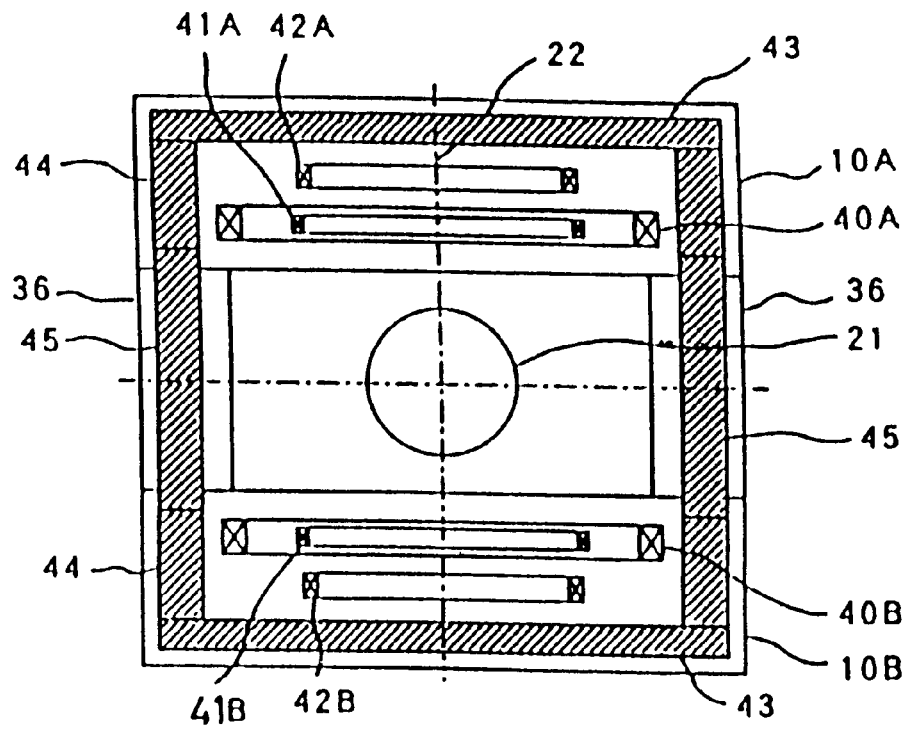

FIG. 2 shows a second embodiment of the superconducting magnet apparatus according to the present invention. FIG. 2(a) is an external view of the configuration of the entire apparatus. FIG. 2(b) is a longitudinal sectional view taken on the center line of this apparatus. This embodiment aims at reducing the size of the apparatus by enclosing all of the ferromagnetic substances 43, 44 and 45 in the vacuum enclosures 10A and 10B. As shown in FIG. 2(b), the superconducting coils 40A, 41A, 42A and 40B, 41B, 42B are accommodated in the vacuum enclosures 10A and 10B and are placed across the uniform magnetic field region 21 in such a way as to face each other vertically, similarly as in the case of the first embodiment of the present invention. In addition, the disk-like ferromagnetic substances 43 and the cylindrical ferromagnetic substances 44 are accommodated in the vacuum enclosures 10A and 10B and are placed in such a manner as to surround the superconducting coils 40A to 42A and 40B to 42B. Moreover, the column-like ferromagnetic substances 45 are also enclosed in the supporting posts 36 also acting as the vacuum enclosures.

With the aforementioned configuration, the diameters of the ferromagnetic substances 43 and 44 can be reduced. Thus, the second embodiment has an advantageous effect in reduction in the weight of the apparatus, in addition to the reduction in the size thereof. Further, generally, the magnetic permeability of a ferromagnetic substance changes with temperature. Thus, in the case that this change in temperature is large, this change in temperature affects the magnetic-field-strength distribution in the uniform magnetic field region 21. However, by enclosing the ferromagnetic substances 43, 44 and 45 in the vacuum enclosures 10A and 10B as in the second embodiment, these ferromagnetic substances are made to become resistant to the influence of a change in room temperature. Consequently, the second embodiment has the advantageous effect in enhancing the stability of the magnetic field.

Figure 3A:
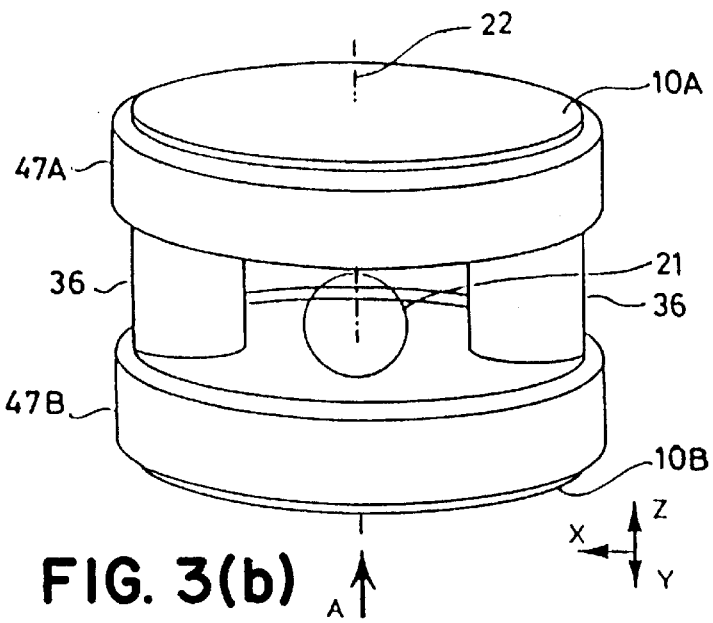
FIGS. 3(a)–(b) show respectively an external view and a longitudinal sectional view taken on the center line of a third embodiment of the superconducting magnet apparatus according to the present invention.
Figure 3B:
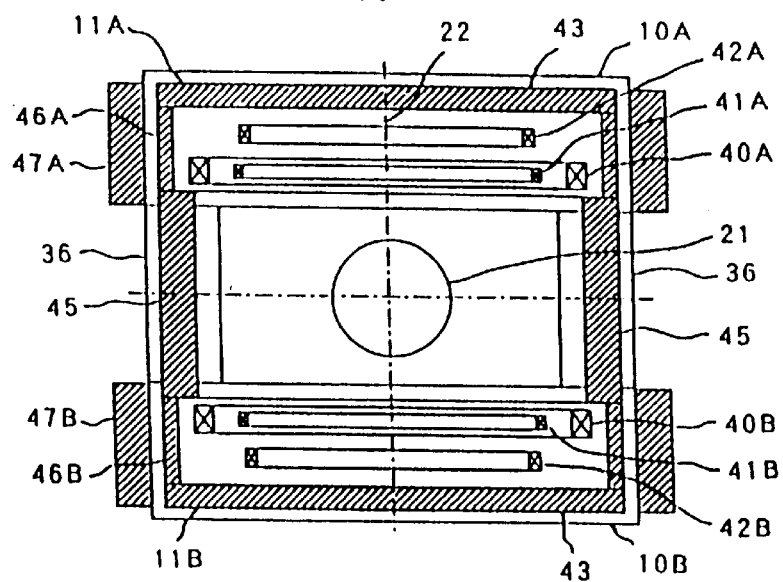

FIG. 3 shows a third embodiment of the superconducting magnet apparatus according to the present invention. FIG. 3(a) is an external view of the configuration of the entire apparatus. FIG. 3(b) is a longitudinal sectional view taken on the center line of this apparatus. In this embodiment, a part of the ferromagnetic substance is placed on the exterior of each of the vacuum enclosures 10A and 10B, differently from the aforementioned second embodiment. As illustrated in FIG. 3(b), the cylindrical ferromagnetic substances are divided into ferromagnetic substances 46A and 46B which have small outside diameters, and ferromagnetic substances 47A and 47B which have large outside diameters. The small-outside-diameter ferromagnetic substances 46A and 46B are accommodated in the vacuum enclosures 10A and 10B. The large-outside-diameter ferromagnetic substances 47A and 47B are placed on the outer peripheries of the vacuum enclosures 10A and 10B.

In the usual case, the magnetic flux density in the cylindrical ferromagnetic substance placed in the vicinity of the main coils 40A and 40B, which have the largest magnetomotive force, becomes highest. Thus, magnetic flux saturation is most likely to occur in this vicinity of the main coils. It is, therefore, necessary to increase the thickness of this part of the ferromagnetic substance. However, when increasing the thicknesses of the ferromagnetic substances, the sizes of the vacuum enclosures 10A and 10B should be increased to a large value. This leads to a rise in the cost of the apparatus. An occurrence of magnetic flux saturation can be substantially prevented without increasing the sizes of the vacuum enclosures 10A and 10B by dividing the cylindrical ferromagnetic substances into such substances of a large outside diameter and the other substances of a small outside diameter and further disposing the large-outside-diameter substances on the exterior of the vacuum enclosures, respectively, as in this embodiment. In this case, it is possible to omit the small-outside-diameter ferromagnetic substances 46A and 46B, which would be provided in the vacuum enclosures 10A and 10B, and to make do only with the large-outside-diameter ferromagnetic substances 47A and 47B.

Figure 4:
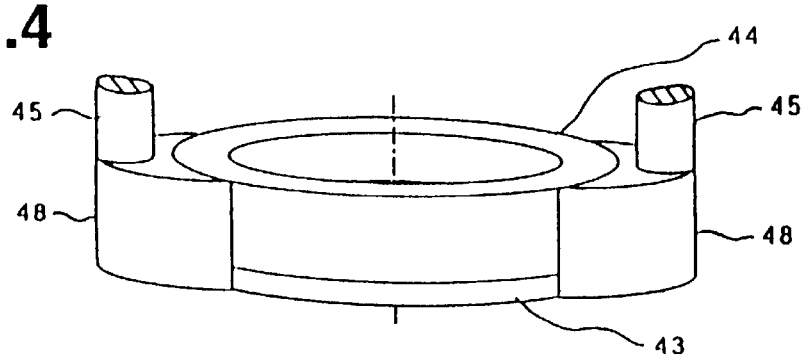
FIG. 4 is a partial external view of a fourth embodiment of the superconducting magnet apparatus according to the present invention.

FIG. 4 shows a fourth embodiment of the superconducting magnet apparatus according to the present invention. FIG. 4 is a partial external view of a ferromagnetic portion provided in a lower part of the apparatus in the fourth embodiment. In this embodiment, the column-like ferromagnetic substances 45 are placed in such a way as to be away from the uniform magnetic field region 21 as shown in FIG. 1(c). Thus, crescent-shaped ferromagnetic substances 48 are placed around the outer peripheries of the disk-like ferromagnetic substances 43 and the cylindrical ferromagnetic substances 44 in such a manner as to magnetically connect therebetween. Further, the column-like ferromagnetic substances 45 are disposed on the top surface of the ferromagnetic substances 48, respectively. Incidentally, the number of the aforementioned crescent-shaped ferromagnetic substances 48 is determined according to that of the column-like ferromagnetic substances 45.

As above described, the influence of the column-like ferromagnetic substances 45 on the magnetic-field-strength distribution in the uniform magnetic field region 21 is reduced, by placing the column-like ferromagnetic substances 45 in such a way as to be away from the uniform magnetic field 21. Moreover, the distance between the column-like ferromagnetic substances 45 is increased, so that the feeling of freedom of the subject is enhanced.

Figure 5:
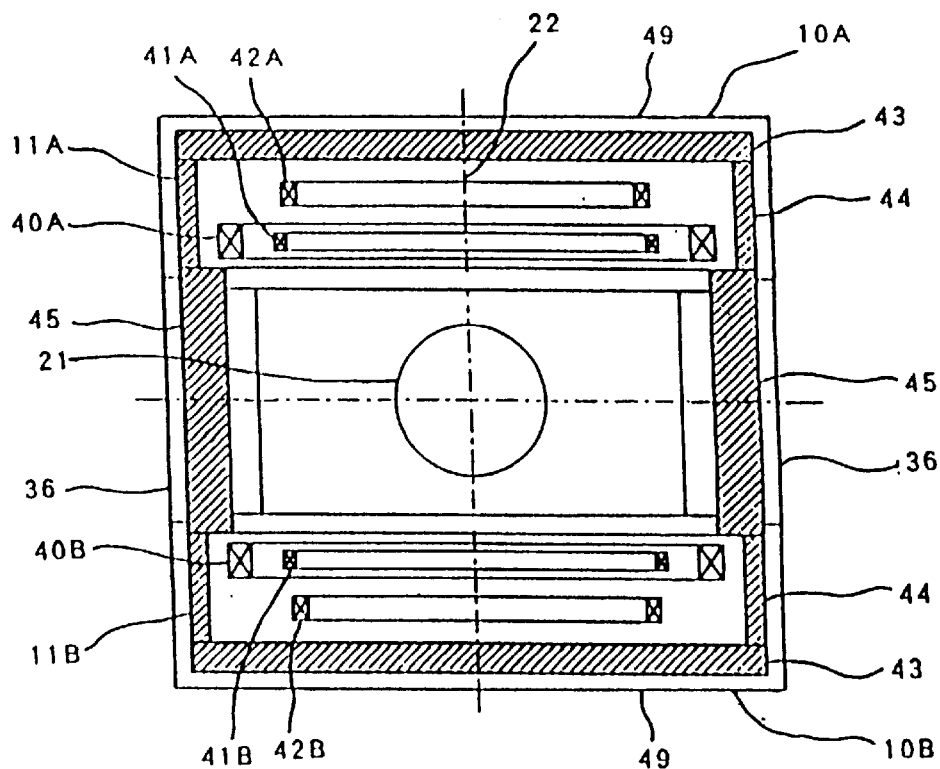
FIG. 5 is a longitudinal sectional view taken on a center line of a fifth embodiment of the superconducting magnet apparatus according to the present invention.

FIG. 5 shows a fifth embodiment of the superconducting magnet apparatus according to the present invention. FIG. 5 is a longitudinal sectional view taken on the center line of this superconducting magnet apparatus in the fifth embodiment. In this embodiment, the ferromagnetic substances are caused to also act as a part of the vacuum enclosures 10A and 10B or of the coolant containers 11A and 11b by manufacturing a part of the vacuum enclosures or the coolant containers by the use of a material having ferromagnetism. In FIG. 5, the disk-like ferromagnetic substances 43 and the cylindrical ferromagnetic substances 44 constitute a part of the coolant containers 11A and 11B for cooling the superconducting coils. Further, the cylindrical ferromagnetic substances 49, 49, which are provided with the bottoms and are placed on the exterior of the coolant containers, constitute a part of the vacuum enclosures 10A and 10B. In FIG. 5, the disk-like ferromagnetic substances and the cylindrical ferromagnetic substances are divided to constitute a part of the vacuum enclosures and the coolant containers. However, the configuration of this embodiment is not limited thereto. Namely, the ferromagnetic substances may constitute a part of only the vacuum enclosures or the coolant containers without being divided.

With the herein-above mentioned configuration, the size of the apparatus can be further reduced, as compared with the case of making the vacuum enclosures or the coolant containers by using materials other than ferromagnetic materials.

Figure 6:
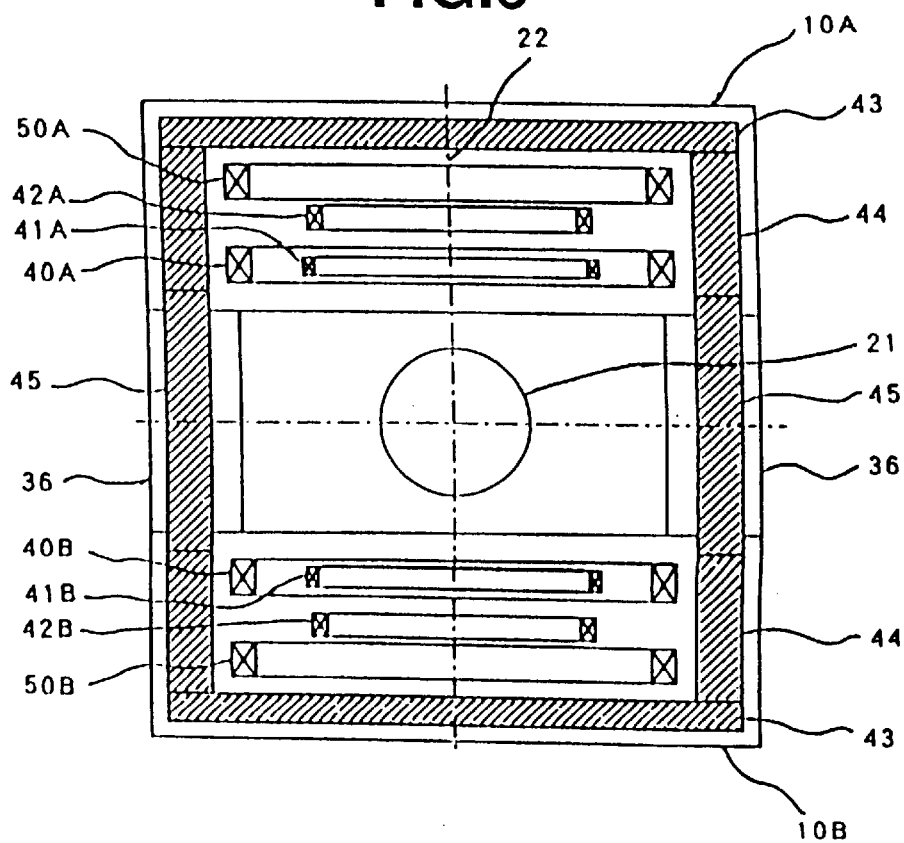
FIG. 6 is a longitudinal sectional view taken on a center line of a sixth embodiment of the superconducting magnet apparatus according to the present invention.
Figure 7A:
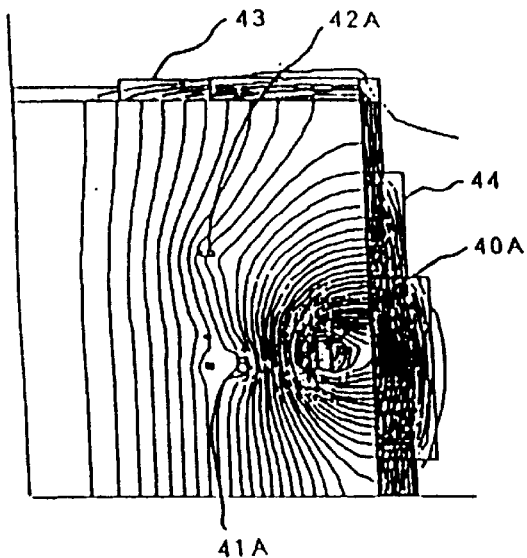
FIGS. 7(a)–(b) are diagrams for explaining examples of the distribution of magnetic flux densities in a ferromagnetic substance in the case where no bucking coils are provided in the apparatus, and in the case where bucking coils are provided therein.
Figure 7B:
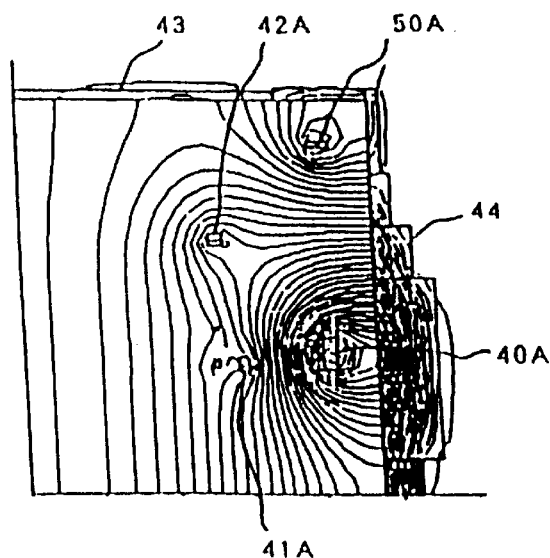

FIG. 6 shows a sixth embodiment of the superconducting magnet apparatus according to the present invention. FIG. 6 is a longitudinal sectional view taken on the center line of the superconducting magnet apparatus, which is the sixth embodiment of the present invention. In this embodiment, bucking coils 50A and 50B are added to the superconducting coils so as to reduce the weight of the ferromagnetic substances placed around the superconducting coils. A magnetic field, which is in an opposite direction to the magnetic field produced by the main coils 40A and 40B, is generated by adding these bucking coils 50A and 50B. Thus, the magnetic flux density in the ferromagnetic substance placed in the proximity of the aforesaid bucking coils 50A and 50B is reduced. FIGS. 7(a) and 7(b) illustrate examples of the distribution of magnetic flux densities in the ferromagnetic substances 43 and 44 in the case where no bucking coils are provided in the apparatus, and in the case where the bucking coils 50A and 50B are provided therein, respectively. FIGS. 7(a) and 7(b) illustrate the magnetic-flux-density distribution in an upper portion (a half part of) of the superconducting magnet apparatus, respectively. As is obvious from FIG. 7(b), the magnetic flux density in the ferromagnetic substances 43 and 44 placed around the bucking coil 50A is clearly reduced by adding the bucking coil 50A to the apparatus. However, although the magnetic flux density in the ferromagnetic substances placed around the main coil 40A increases slightly, it is confirmed that there is not a very noticeable increase. As a result, the thickness of the ferromagnetic substances 43 and 44 placed around the bucking coils 50A and 50B can be reduced to a small value. Consequently, this embodiment has an advantageous effect in that the weight of the ferromagnetic substance can be decreased.

Figure 8:
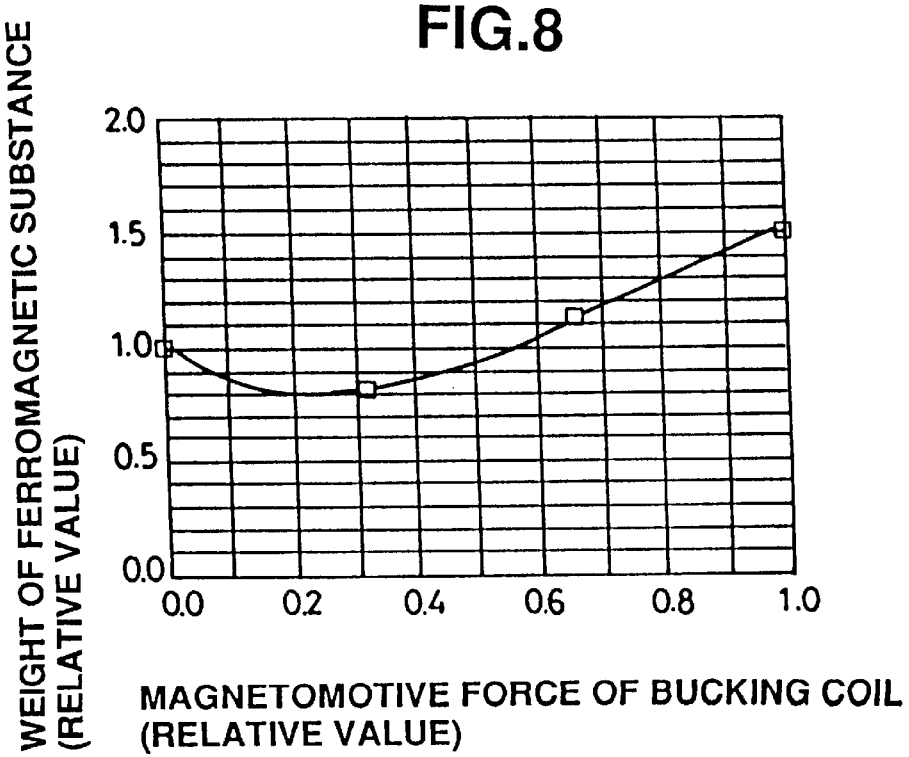
FIG. 8 is a graph illustrating the relation between the magnetomotive force of a bucking coil and the weight of a ferromagnetic substance.

However, if the magnetomotive forces of the aforementioned bucking coils 50A and 50B are made to be too large, a magnetic flux saturation occurs in the ferromagnetic substances, that are close to the main coils 40A and 40B. Thus, the thickness of these ferromagnetic substances, which are close to the main coils, should be increased. In connection with this, the relation between the magnetomotive force of the bucking coils 50A and 50B and the weight of the ferromagnetic substance was studied. An example of a result of the study is shown in a graph of FIG. 8. This graph shows a result of calculation of change in the weight of the ferromagnetic substance, which is needed to perform desired shielding when increasing the magnetomotive force of the bucking coils 50A and 50B, by computer simulation. In the case of this example, the result reveals that the necessary weight of the ferromagnetic substance becomes minimum when the magnetomotive force of the bucking coils 50A and 50B is set at a value within a range of 0.2 to 0.3 (relative value) or so. This optimum magnetomotive force varies with the strength of the magnetic field generated in the uniform magnetic field region 21 and with the specifications of the leakage magnetic field. Therefore, the optimization by computer simulation or the like is needed.

Figure 11:
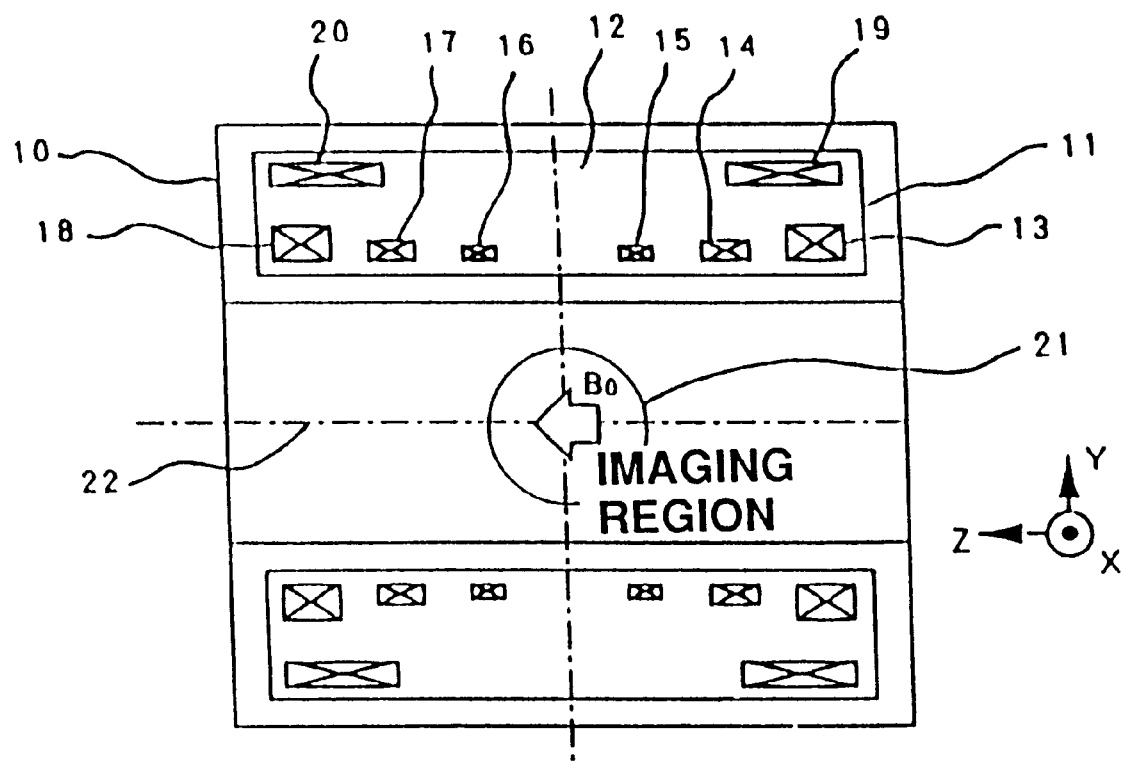
FIG. 11 is a diagram for illustrating the first example of a conventional superconducting magnet apparatus for use in MRI system.

Further, the division of the bucking coils 50A and 50B into a plurality of groups so as to disperse the magnetic flux density is also effective, in order to prevent an occurrence of magnetic flux saturation in the ferromagnetic substance. Incidentally, the aforementioned method of decreasing the weight of the ferromagnetic substance by optimizing the magnetomotive force of the bucking coil can be applied to the magnet of the horizontal magnetic field type described as the conventional apparatus illustrated in FIG. 11.

Figure 9:
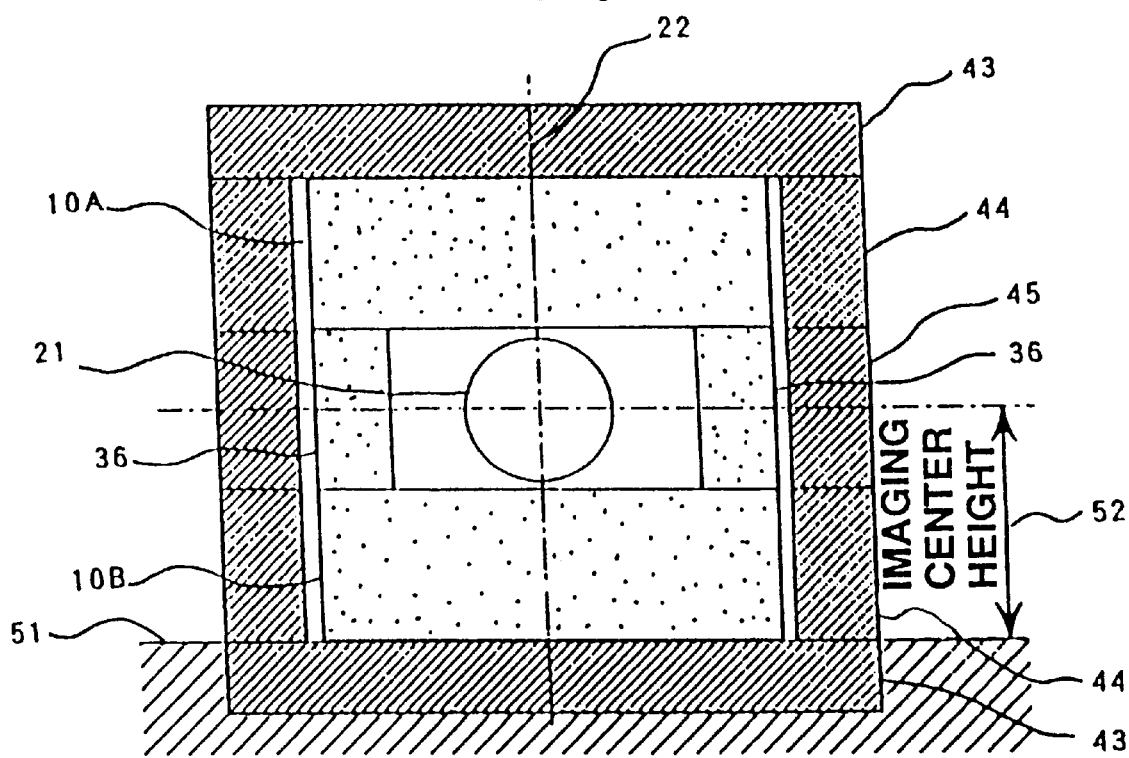
FIG. 9 is a longitudinal sectional view taken on a center line of a seventh embodiment of the superconducting magnet apparatus according to the present invention.

FIG. 9 shows a seventh embodiment of the superconducting magnet apparatus according to the present invention. FIG. 9 is a longitudinal sectional view taken on the center line of the superconducting magnet apparatus in the sixth embodiment. This embodiment adopts a structure in which the disk-like ferromagnetic substance 43 to be placed in the lower portion of the apparatus is embedded in the floor of the room, in which the apparatus is installed. As shown in FIG. 9, the lower disk-like ferromagnetic substance 43 is embedded under a floor face 51, so that an imaging center height 52 from the floor face 51 to the center of the uniform magnetic field region 21 becomes low. As a consequence, this saves a subject from the trouble of feeling claustrophobic. Moreover, the subject can easily get on and off a table.

Furthermore, in order to stand up to the weight of the apparatus, it is common to reinforce the installation floor with iron plates when installing a superconducting magnet apparatus in a hospital or the like. Such reinforcing iron plates can be also used as the disk-like ferromagnetic substances 43 located in the lower portion of the apparatus.

Figure 10:
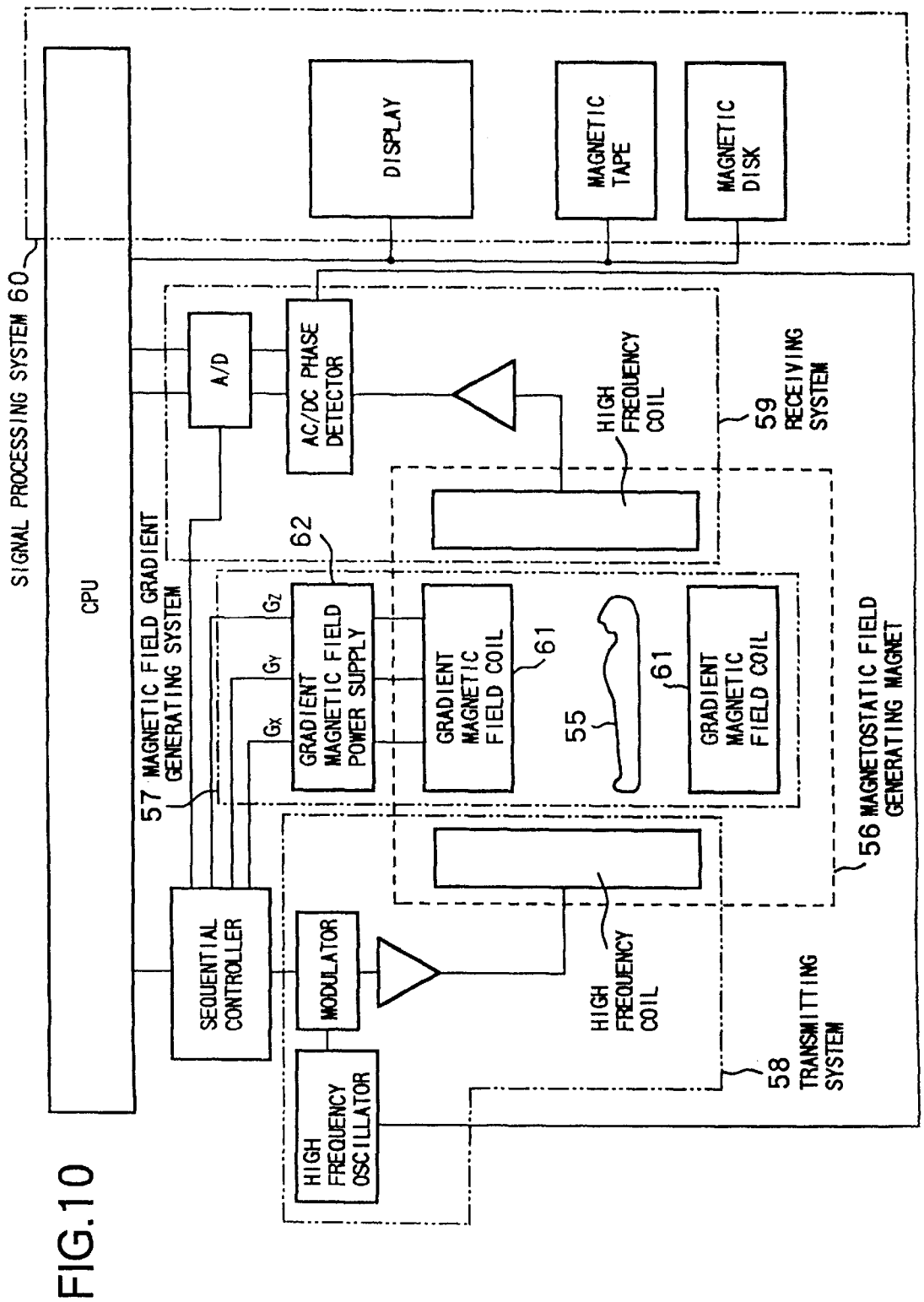
FIG. 10 is a block diagram illustrating the configuration of the entire MRI system of the present invention.

Referring next to FIG. 10, there is shown the configuration of the entire magnetic resonance imaging system using the aforementioned superconducting magnet apparatus. This magnetic resonance imaging system is used to obtain a tomogram of a part to be diagnosed of the subject by utilizing a nuclear magnetic resonance phenomenon caused in tissues of the subject. As illustrated in FIG. 10, this magnetic resonance imaging system comprises: a magnetostatic field generating magnet 56 serving as a magnetostatic field generating means for giving a magnetostatic field to a subject 55; a magnetic field gradient generating system 57 acting as a gradient magnetic field generating means for giving a gradient magnetic field to the aforesaid subject 55; a transmitting system 58 for irradiating the subject 55 with high-frequency signals so as to cause nuclear magnetic resonance in atomic nuclei of atoms composing tissues of the aforementioned subject 55; a receiving system 59 for detecting high-frequency signals issued due to the aforementioned nuclear magnetic resonance; and a signal processing system 60 for performing an image reconstruction operation by using the high-frequency signals detected by this receiving system 59 and for displaying an image. Incidentally, for example, a permanent type magnet, a normal conducting magnet or a superconducting magnet may be used as the magnetostatic field generating magnet 56. Further, the magnetic field gradient generating system 57 consists of a gradient magnetic field coil 61 and a gradient magnetic field power supply 62.

Here, note that the superconducting magnet apparatuses as illustrated in FIGS. 1 to 6 and 9 are used in the system of the present invention as the aforementioned magnetostatic field generating magnet 56. Consequently, by making good use of the advantages of the aforementioned superconducting magnet apparatus according to the present invention, a system having the magnetostatic generating magnet 56 can be realized as a magnetic resonance imaging system, in which a large opening is provided so that a subject does not feel claustrophobic and that an operator can easily get access to the subject, and in which each of the groups of the magnetic field generating elements is surrounded by the ferromagnetic substances so that magnetic field leakage into the outside of the apparatus is reduced and that the manufacturing cost can be cut down.

Industrial Applicability

As above described, in accordance with the present invention, an opening, which accommodates a subject, of a superconducting magnet apparatus are enlarged to thereby prevent the subject from feeling claustrophobic. Further, an operator can easily get access to the subject. Moreover, there can be provided a superconducting magnet apparatus, wherein magnetic field leakage can be reduced and the manufacturing cost can be cut down.

Moreover, by using the aforementioned superconducting magnet apparatus as the magnetostatic field generating magnet, a magnetic resonance imaging system which makes use of the advantages of the superconducting magnet apparatus can be realized.

We claim:

1. A superconducting magnet apparatus comprising:

a magnetic field generating source which is made of substances having superconducting properties and is operative to generate a uniform magnetic field in a first direction, in a finite region; and cooling means for cooling said magnetic field generating source to a temperature, at which the substances exhibit the superconducting properties, and for maintaining said magnetic field generating source at the temperature; wherein said magnetic field generating source includes two sets of magnetic field generating devices that are placed in such a way as to face each other across said uniform magnetic field region along the first direction, each of the two sets of magnetic field generating devices comprising a first magnetic field generating device for generating a main component of said uniform magnetic field and a second magnetic field generating device having an outside diameter smaller than an outside of diameter of said first magnetic field generating device for improving magnetic homogeneity of said uniform magnetic field;

wherein said cooling means is includes two cooling vessels, each of said cooling vessels accommodating one of said two sets of magnetic field generating devices, and wherein a plurality of first ferromagnetic substances are placed in such a manner as to face each other across said uniform magnetic region along the first direction and being located outside of the placement said two sets of magnetic field generating devices with respect to said uniform magnetic field region, and second ferromagnetic substances are provided for mechanically and magnetically connecting said first ferromagnetic substances.

2. A superconducting magnet apparatus according to claim 1, wherein each of said first ferromagnetic substances comprise a third ferromagnetic substance of a cylinder shape extending in the first direction.

3. A superconducting magnet apparatus according to claim 1, wherein at least a part of said first ferromagnetic substances is placed in said cooling means.

4. A superconducting magnet apparatus according to claim 1, wherein at least a part of said first ferromagnetic substances is placed on the exterior of said cooling means.

5. A superconducting magnet apparatus according to claim 4, wherein there is provided fourth ferromagnetic substances that are placed on the exterior of said cooling means.

6. A superconducting magnet apparatus according to claim 1, wherein each of said first ferromagnetic substances also serves as a part of said cooling vessel.

7. A superconducting magnet apparatus according to claim 1, wherein each of said second ferromagnetic substances also supports said cooling vessel.

8. A superconducting magnet apparatus according to claim 1 or 2, wherein each of said first ferromagnetic substances is formed so that a length in the first direction of a part thereof at the connection part with said second ferromagnetic substance is longer than a length of another part in the first direction.

9. A superconducting magnet apparatus according to claim 1, wherein said magnetic field generating source is placed so as to correct a magnetic field generated in said uniform magnetic field region in combination with said first ferromagnetic substances with said second ferromagnetic substances, so that a desired magnetic field strength and homogeneity are obtained in said uniform magnetic field region.

10. A superconducting magnet apparatus according to claim 1 or 2, wherein said two sets of magnetic field generating devices include at least one third magnetic field generating device placed outside of the location of said two sets of first magnetic field generating devices with respect to said uniform magnetic region.

11. A superconducting magnet apparatus according to claim 10, wherein said third magnetic field generating device provides a magnetomotive force so that a weight of said first ferromagnetic substances becomes almost minimum.

12. A magnetic resonance imaging system comprising: a magnetostatic field generating means for giving a magnetostatic field to a subject; a gradient magnetic field generating means for giving a gradient magnetic field to the subject; a transmitting system for irradiating the subject with high-frequency signals so as to cause nuclear magnetic resonance in atomic nuclei of atoms composing tissues of the subject; a receiving system for detecting high-frequency signals issued due to the nuclear magnetic resonance; and a signal processing system for performing an image reconstruction operation by using the high-frequency signals detected by said receiving system and for displaying an image:

wherein said magnetostatic field generating means comprises a magnetic field generating source which is made of substances having superconducting properties and is operative to generate a uniform magnetic field in a first direction, in a finite region; said magnetic field generating source including two sets of magnetic field generating devices placed in such a way as to face each other across said uniform magnetic field region along the first direction, each of said two sets of magnetic field generating devices comprising a first magnetic field generating device for generating a main component of said uniform magnetic field and a second magnetic field generating device having the outside diameter smaller than an outside of diameter of said first magnetic field generating device for improving magnetic homogeneity of said uniform magnetic field; and wherein a plurality of first ferromagnetic substances are placed in such a manner so as to face each other across said uniform magnetic field region along the first direction and being located outside of the placement of said two sets of magnetic field generating devices with respect to said uniform magnetic field region, and second ferromagnetic substances are provided for mechanically and magnetically connecting said first ferromagnetic substances.

13. A magnetic resonance imaging system according to claim 12, wherein each of said first ferromagnetic substances comprises a third ferromagnetic substance of a cylinder shape extending in the first direction.

14. A magnetic resonance imaging system according to claim 12, wherein said system further comprises a cooling means including two sets of cooling vessels, each of which accommodates one of said two sets of magnetic field generating devices, and for cooling and maintaining said magnetic field generating source to a temperature at which said magnetic field generating source exhibits superconducting properties, and at least a part of said first ferromagnetic substances is accommodated in said cooling means or at least a part of said cooling means is accommodated in said first ferromagnetic substances.

* * * * *